(12) United States Patent
Waschura et al.

(10) Patent No.: US 7,363,562 B2
(45) Date of Patent: *Apr. 22, 2008

(54) METHOD AND APPARATUS FOR DEFERRED DECISION SIGNAL QUALITY ANALYSIS

(75) Inventors: Thomas E. Waschura, Menlo Park, CA (US); Andrei Willis, Menlo Park, CA (US); Clint Fincher, Menlo Park, CA (US)

(73) Assignee: Synthesys Research Inc, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/226,690

(22) Filed: Sep. 14, 2005

(65) Prior Publication Data
US 2006/0069971 A1    Mar. 30, 2006

Related U.S. Application Data

(60) Provisional application No. 60/614,366, filed on Sep. 27, 2004.

(51) Int. Cl.
*G01R 31/28* (2006.01)
(52) U.S. Cl. ........................ 714/731; 714/704
(58) Field of Classification Search ........... 327/159, 327/160; 329/347; 375/224, 228, 340; 702/8, 702/65; 714/704, 705, 724, 731, 733, 734
See application file for complete search history.

(56) References Cited

U.S. PATENT DOCUMENTS

| 6,430,720 B1 * | 8/2002 | Frey et al. ............. 714/744 |
| 6,728,311 B1 * | 4/2004 | Waschura et al. ....... 375/224 |
| 2006/0067392 A1 * | 3/2006 | Waschura ............... 375/224 |

FOREIGN PATENT DOCUMENTS

EP    1143654 A2 * 10/2001

* cited by examiner

*Primary Examiner*—Charles Rones
*Assistant Examiner*—Daniel Kuddus
(74) *Attorney, Agent, or Firm*—Peninsula IP Group; Douglas A. Chaikin

(57) ABSTRACT

A signal analysis circuit includes a sampling circuit operative to sample the characteristics of an input signal at various points within a bit window in response to a sample clock signal. A sampling control circuit is coupled to the sampling circuit and is operative to provide the sample clock signal in response to a sample control signal. The sample clock signal provides a variable time function such that the input signal characteristics may be sampled at several times during the input signal or bit window period. A control circuit is coupled to the sampling circuit and the sampling control circuit, and is operative to provide the sample control signal in response to the number of times the input signal is within a signal characteristic of interest. In an exemplary embodiment, the characteristic of interest is a reference pattern that may be synchronized with the input data signal. The reference pattern is provided a pattern generation circuit that is resident within a larger comparison and counting circuit.

9 Claims, 3 Drawing Sheets

METHOD AND APPARATUS FOR DEFERRED DECISION SIGNAL QUALITY ANALYSIS

The present application claims the benefit of U.S. Provisional Application Ser. No. 60/614,366 having a filing date of Sep. 27, 2004.

BACKGROUND OF THE INVENTION

1. Field of the Invention

The present invention generally relates to diagnostic and test equipment for analyzing high-speed data bit streams and, more particularly, to devices and methods capable of measuring, among other things, the signal quality of a data communications receiver by delaying the effective decision point of the device under test (DUT) to perform analysis such as bit error rate, eye diagramming, mask testing and other common measures of signal quality.

2. Description of the Related Art

In recent years, the performance of a high-speed communication facility or device has risen to a point that the ability of accurately measuring its quality has become an ever-increasing challenge. In the area of data communication devices, for example, efforts to reduce size and power while increasing the throughput of a device have increased the possibility of error. Network suppliers, integrators and users want assurances that such devices will perform reliably and can accommodate data transmission rates that routinely exceed several gigabits/second. Providing such assurance requires determining the effective error rate and signal quality of the data received by a high-speed communications device.

In order to test a receiver, one needs the receiver in the testing path. Receivers of modern, high-performance channels incorporate sophisticated input signal conditioning (both intended and non-intended) as well as advanced decision circuits. Decision-making in the face of the applied signal conditioning is what must be tested. Conventional methods for testing receivers include creating a stressed input to the receiver whereby the stress is meant to emulate the "worst-case" applied input signal. Logically, if the receiver was able to operate error-free in face of this "worst-case" input signal, the receiver was assumed good. Typically, using this worst case scenario to see whether the receiver is operating error-free is a far simpler task than doing a full diagnostic analysis using sophisticated receivers built inside commercial test equipment (used to test transmitters and communications channels).

To test if a receiver is operating error-free, the result of the received decision can be sent to a bit error rate checking device and measured. A bit error rate checking device is small enough that many receiver DUTs have them built-in as they are comprised of compact exclusive-OR and counting logic, internal to the DUT. Alternatively, many receiver DUTs are actually transceiver devices (they have transmitters along side their receivers) and they support testing modes that re-transmit the received signal. This re-transmitted signal can then be connected to an outside bit error rate testing instrument for testing.

There are several commercially available testing systems that characterize and validate the performance of a data signal from a device or communications subsystem using bit error rate and eye diagramming oscilloscope measurement methods. In these systems, the analysis is done at the input to the commercial test system. This is ideal for testing transmitters and/or channels where an output of the device under test is available to inspect. However, as noted above these techniques and structures are not useful for testing receivers where no output is readily available.

Drawbacks of these conventional systems include the real possibility that the stressed-eye condition does not represent the actual worst case application signal. Clearly, then the entire assumption that a DUT was sound would be or at least could be false. Additional drawbacks of these conventional system include that they provide insufficient data to have a diagnostic understanding as to what the receiver is actually. Clearly, if one had such data many more issues would be understood and resolved and done so more efficiently. Another drawback associated with conventional systems is the inability of using known extrapolation techniques for grading performance deeper than the measurement time. For example if one could do so, it might well indicate an ability to use well-understood analysis techniques already developed for non-receiver testing for doing deeper diagnosis on receiver DUTs.

Digital receiver circuits are different than digital channel circuits. Digital receiver circuits accept an input signal from a digital channel. This input signal is an analog voltage that must be interpreted to determine what digital value was being sent. This interpretation involves looking at the voltage levels and timing present on the analog signal. One way of doing this is to use a voltage comparator to logically slice the analog input as being either above or below a preselected logic threshold and a D-flip flop to then sample the result of the comparator at time instants that correspond to proper bit periods of the data being carried by the analog voltage on the digital channel. Once the decision is made, the output from the decision circuit is simply a logical output (high or low) and looses all other characteristics of the analog input signal—characteristics that, if measured, provide numerous benefits in understanding and extrapolating performance. Therefore, the normal result of the digital receiver circuit hides the ever-important information needed for diagnostic evaluation by transforming the analog input signal into digital ones and zeros.

Other elements of a digital communications system (including digital channels circuits) have easy access to the analog voltages used to communicate digital information. This easy access allows for easy measurement. For example, a signal from the transmitter half of an Ethernet port can easily be measured on an Ethernet cable. In this case, the Ethernet port is the transmitter and the cable is the digital channel circuit. The voltages on the cable comprise the analog signal that is carrying the information and this can be presented to a measuring device (such as an oscilloscope) for analysis. No such convenience exists if one wants to examine the receiver half of the Ethernet Port. Analysis of the digital receiver is not possible as it is not accessible.

Typical techniques for analyzing channel circuit are not available in analyzing receiver circuits. For example techniques such as bit error rate testing, eye diagramming, jitter measurement, Q-factor measurement, eye-diagram mask testing, fast "four-corners" margin testing, frequency response, step response all depend upon the ability to manipulate the decision point of a digital decision circuit while collecting bit error or probability of occurrence information. This cannot be done on receiver circuits. It will be appreciated that specialized machines are available on specialized commercial test instruments with specialized receiver circuits intended for use only on transmitter and channel testing (not receiver testing).

SUMMARY OF THE INVENTION

A signal analysis circuit includes a sampling circuit operative to sample the characteristics of an input signal at various points within a bit window in response to a sample clock signal. A sampling control circuit is coupled to the sampling circuit, and is operative to provide the sample clock signal in response to a sample control signal. The sampling clock signal provides a variable time function such that common input signal characteristics may be sampled at several or various times during the period of the input signal. The signal analysis circuit also includes a control circuit that is operative to provide the sample control signal in response to the number of times the input signal is within or exhibits a signal characteristic of interest.

It is a general object of the present invention to provide a method and apparatus for measuring a receiver DUT at the decision point to provide useful data for performing a diagnostic analysis.

It is an additional object of the present invention to provide a method and apparatus for measuring a receiver DUT at the decision point to provide useful data without causing dramatic or costly changes to the DUT.

It is an additional object of the present invention to provide a method and apparatus for measuring a receiver DUT at the decision point to provide useful data to serve the greatest spectrum possible of such devices to be tested.

The invention accomplishes its objects by, among other things, moving or the effective location of decision in the receiving circuit of the DUT. The method and apparatus of the invention passes or defers the results of these decisions to the necessary counting and comparing circuits in an outside counting logic or in an outside instrument such as advanced bit error rate testers as required to get the information necessary to perform advanced analysis techniques to implement receiver quality testing.

Effecting the decision of the receiver DUT or decision circuit can be done in many ways including augmenting the receiver DUT decision circuit with special controls intended for this purpose. For example in one exemplary embodiment of the invention the DUT is augmented with a variable threshold control and a variable sampling-time control. An external clock and a sine wave generator are added for controlling the external signal level and clock timing.

In another embodiment, the single decision point comparator used inside the receiver DUT is augmented with a second (and in other embodiments a plurality) of related threshold decisions. The results from these decisions create a window or group of window comparison results. These results are used as the deferred decision points to further enhance the analysis done at the input of the receiving circuit.

BRIEF DESCRIPTION OF THE DRAWING

For a further understanding of the objects and advantages of the present invention, reference should be had to the following detailed description of the invention, taken in conjunction with the accompanying drawing, in which like parts are given like reference numerals and wherein.

DETAILED DESCRIPTION OF THE INVENTION

The present invention will now be described in greater detail with reference to FIGS. 1-5, in which the preferred embodiments of the present invention are shown. The present invention may, however, be embodied in many different forms and should not be construed as limited to the embodiment set forth herein; rather these embodiments are provided so that this disclosure will be thorough and complete and will fully convey the invention to those skilled in the art.

Additionally, in order to fully appreciate this invention reference is made to other pending applications, assigned or otherwise owned by the assignee of the present invention and application. Each of the applications set forth below is specifically incorporated in their entirety herein by reference. The disclosures are as follows: U.S. patent application Ser. No. 09/996,342, filed Nov. 21, 2001; U.S. patent application Ser. No. 10/099,487, filed Mar. 15, 2002; U.S. patent application Ser. No. 10/097,706, filed Mar. 14, 2002; and co-filed U.S. patent application entitled "Method and Apparatus for Measuring the Input Frequency Response of a Receiver".

The present invention does not specifically relate to mechanisms for accumulating and processing threshold information to perform advanced analysis techniques. Rather, the present invention discloses how the decisions can be made remotely at the receiver DUT's decision circuit and then passed along to outside counting and comparing circuits to affect the same analysis result.

All of this is significant because the state of the art in testing at the inputs of digital receivers does not include access to these otherwise well used and understood analysis views. Eye diagrams, for instance, are a mainstay of testing the communication ability of a digital system; however, before the present invention, it was impossible to view the eye diagram as seen by the input of the receiver circuit in the DUT. Further, knowing what the eye diagram looks like on the input of the commercial oscilloscope or advanced bit error rate tester is not helpful when what you want to know is what the receiver circuit would see. Especially today with highly integrated receiver circuits that include signal-processing techniques such as equalization, the eye at the input to the receiver chip may not be the eye that is at the input to the final decision circuit deep within a chip.

Figure 1:
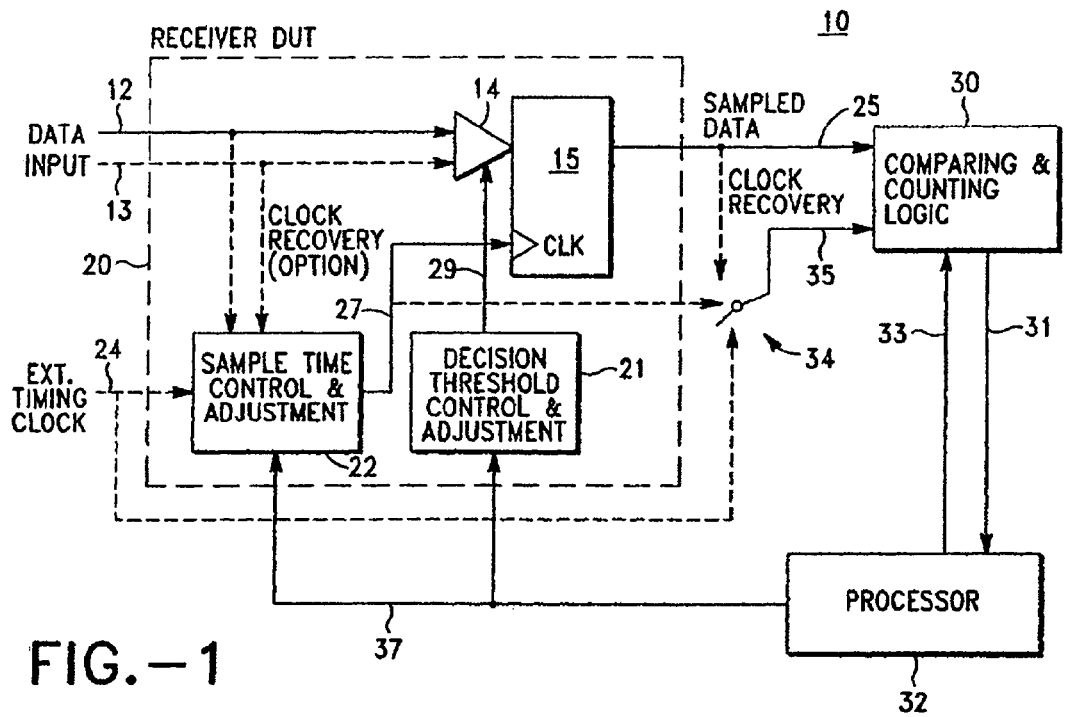
FIG. 1 is a schematic block diagram of a device under test and its corresponding decision circuit with internal timing and sampling adjustment components according to an exemplary embodiment of the present invention.

FIG. 1 is a schematic block diagram of a device under test (DUT) 10, for example, an electrical or electrical/optical transceiver such as a 10 Gb Ethernet transceiver and its corresponding decision circuit 20 with internal support components for adjusting the decision threshold (e.g. voltage) 21 and sample timing 22 according to the present invention. The decision circuit 20 includes a comparator 14, having an input data signal 12 coupled to a first input thereof, and a threshold voltage value (e.g. signal) 29 coupled to a control input thereof. A secondary input signal 13 may be provided to a second input of the comparator 14 to provide for additional comparison. The output of the comparator 14 is a signal indicating, for example, the difference between the characteristics (e.g. voltage) of the signals present on the corresponding first and second inputs thereof. Alternatively, the output of the comparator 14 may be a signal representing whether the input data signal exceeds or is below the threshold value 29 provided by a decision threshold control circuit 21. The output of the comparator 14 is provided as an input to a sampling device 15, for example a D-type flip flop, configured to sample the signal provided at its input in response to a sample clock signal 27 provided by a sample time control and adjustment circuit 22. In this manner, the decision point of where the input data signal 12 is sampled can be varied in response to the particular analysis of interest.

As will be illustrated and discussed in greater detail below, the sample clock signal 27 and the threshold control signal 29 may be provided independently of one another to implement the various analysis requirements of a receiver or other DUT to which the present invention forms a part. In this manner, the sampling period (e.g. bit window) and the threshold value(s) of interest may be independently set, with the corresponding sampling of the input data signal 12 relative to the threshold value being movable and independently controlled. Additionally, the sample time and control circuit 22 and the decision threshold control and adjustment circuit 21 may be implemented internal to the decision circuit 20 or outside the decision circuit 20.

The sampled data 25 output from the decision circuit 20 is provided to an external comparing and counting logic circuit 30, which it interfaced to a control circuit 32, for example, a microprocessor, microcontroller, dedicated hardware (e.g. ASIC), or software executing on one or more processors, to affect the functionality of the present invention. The sample time 27 and sample voltage 29 offsets are set by the control circuit 32 to the sample position required by the analysis. The results provided by the decision circuit 20 are not used by the DUT, per se, but are forwarded to the external comparing and counting logic 30 to make the analysis. In this manner, any programmable threshold voltage or sample timing supported by the comparing and counting logic (for example, such settings are found in bit error rate testers) must be set to conditions that simply defer the decision made at the decision circuit 20 to the comparing and counting logic 30. To defer this decision, the threshold voltages and sampling times possibly found in the comparing and counting logic (i.e. BER tester) would be set to nominal voltage and setting times that would pass the decision along.

The resolution and range supported by the sample time control adjustment circuit 22 and the decision threshold control adjustment circuit 21 may vary and do not have to cover the entire range of the possible decision threshold voltage and sample time within a bit period. Any reduced range will limit the amount of range available for the deferred analysis. Similarly, any reduced resolution will limit the amount of resolution available for the deferred analysis. It is anticipated that an exemplary embodiment of this invention will support as few as only two settings for the decision threshold voltage and decision sample time. In this case, a high and a low decision voltage threshold and an early and late decision sample time can be used to bracket the nominal operating point of the decision circuit in the receiver DUT and can be used to assess available margin in the receiver.

As shown, the control circuit 32 is coupled to a sample time control and adjustment circuit 22 via the sample control signal 37. An external clock (not shown) is provided for generating an external clock signal 24 to the decision circuit 20. A comparing and counting logic circuit 30 is provided for receiving the results of the sampled input signal 25. The control circuit 32 may be integrated with the comparing and counting logic circuit 30. For example, such an integrated device comprise a bit error rate tester. Other dedicated test instruments are also suitable. A separate control circuit which interfaces to the decision circuit 32 and the comparing and counting circuit 30 is also suitable.

The clocking or triggering signal 35 for the comparing and counting circuit 30 can come from various sources in this invention, for example switch 34. It is required that the clock signal 35 be synchronous with the deferred decisions 25 already made by the receiver decision circuit 20. This is achieved by using the same external timing reference clock signal 27 as used by the receiver decision circuit 20. Alternatively, it is also possible in many cases to use a recovered clock, which is recovered from the sampled data 25 on the way into the comparing and counting logic 30. This final option is restricted to analysis types, which set the decision threshold 29, and sample time 27 to values that still yield sufficient sampled data content to support accurate clock recovery. Generally, this means that the sample time signal 27 and decision threshold signal 29 are still nominally in the center of the eye or at nearby areas which still yield bit error rates better than $1 \times 10^{e-2}$. It would not be acceptable, for example, to move the decision threshold 29 above the logic high level in the decision circuit of the receiver decision circuit 20 and then try to recover a clock from the sampled data 25 as the sampled data 25 in this case would be all zeroes (the threshold is above all the data bits so all samples look like zeroes).

The sample time and adjustment circuit 22 for setting the sample time and decision threshold value 27 in the decision circuit 20 may take the form of a digital control bus or dedicated control voltages. For instance, in an exemplary embodiment of the present invention, a three-wire serial control bus also otherwise used for management data input and output (MDIO) can be used. When a bus structure is used (parallel or serial) an address would be set aside for the decision threshold level 29 and the sample time offset 27. Writing a new value to either of these addresses would change the setting. Writing to these addresses is the responsibility of the control circuit 32.

The counting and comparing logic circuit 30 may be dedicated hardware or may be a configuration of hardware found in more general test instruments. Examples of instruments that include functions that may be used to perform this function (or a sub-set of the function) include bit error rate testers and digital event counters. In an exemplary embodiment of the present invention, a commercial bit error rate tester is used. In this way, the error detector of the bit error rate tester is synchronized to the sampled data 25 and mismatches between the sampled data 25 and the expected data (as determined by the reference pattern generator in the error detector after synchronization) 151 (FIG. 5) are counted and used in the analysis. Examples of patterns that are used by the comparing logic circuit 30 found within an error detector include either the data pattern being transmitted to the decision circuit 20 during the test or an all-ones pattern or an all-zeroes pattern. The received test pattern would be used when the decision threshold is "inside" the eye diagram as the normal output sampled data 25 would appear predominantly as the DUT test pattern. An all-ones pattern would be used when the decision threshold 29 of the sampling device 15 is set nominally below the data signal levels as the predominant sampled data level will also be all ones. Similarly, the all-zeroes pattern would be used when the decision threshold 29 of the decision circuit 20 is set nominally above the data signal levels. In this case, the sampled data 25 will predominantly be zeroes.

Coupling between the data input signal 12 and the decision circuit 20 can easily support either AC or DC coupling and the requirement for either would be driven by the application and specification of the decision circuit 20. The coupling between the sampled data 25 and the comparing and counting circuit 30 also can be either AC or DC coupling; however, if AC coupling were used, limitations would exist on the legal settings for decision thresholds 29 in the decision circuit 20 to maintain sufficient AC-content to successfully pass the sampled data through the AC-coupling. For example, if the decision threshold signal 29 value is set above the logic high threshold, the sampled data 25 would approach an all-zeros condition. An all-zeros condition on the output of the decision circuit 25 would have no AC-content and would not pass through the DC-block present in the AC-coupling configuration. This would limit analysis types that included a requirement to set the decision threshold above or below the entire data levels. For example, this would limit the ability to draw eye diagrams above or below the logic rails or perform mask testing above or below the logic rails. Even with this limitation, this invention still affords the user the ability to examine the opening area of the eye, which is where logic decisions are made. This is sufficient to determine margin and decision-making quality.

Figure 2:
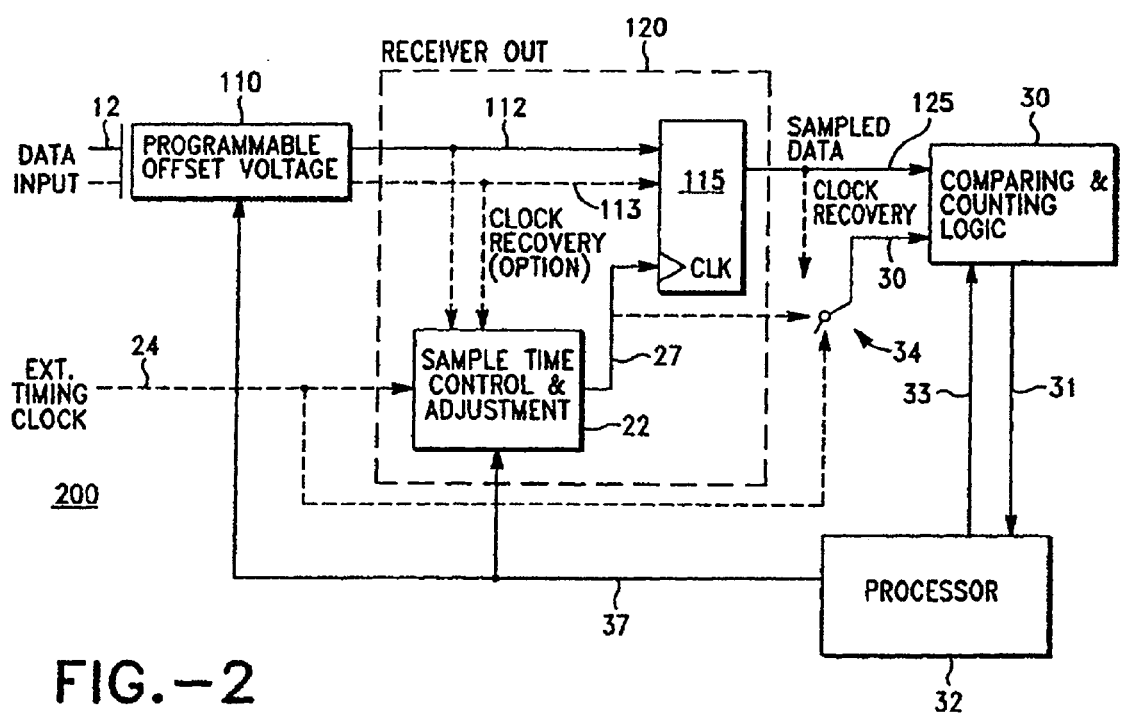
FIG. 2 is a schematic block diagram of a second exemplary embodiment of the present invention including a customized receiver DUT decision circuit with enhancements for controlling decision threshold and/or decision timing offset within the bit period for use with this invention.

FIG. 2 is a schematic block diagram of an alternate embodiment 200 of the present invention, including programmable voltage offset 110 injected into the DC level of the data pattern 12 presented to the data input of the decision circuit 20 of the receiver DUT rather than having direct control over the decision threshold value of the previous embodiment. The architecture of this alternate embodiment 200 includes many of the same components as the first embodiment 10 and such components are connected in a manner consistent with the earlier described embodiment except for the differences described herein.

This alternate embodiment 200 is applicable where the receiver decision circuit 120 uses a fixed DC voltage (or voltage difference in the case of differential inputs) for the threshold and where a fixed DC voltage offset 110 can be injected on purpose to the input signal 12, which will effectively shift the decision threshold. This alternate embodiment 200 would not be applicable where the device under test uses an AC-coupling on the data inputs to the receiver circuit as the injected DC amount (put into the test pattern at the pattern generator) 110 would be stripped-off by the DC-blocks used to implement the AC-coupling.

This alternate embodiment 200 offers a significant advantage to those applications that support DC-coupled inputs and fixed thresholds because there is no added control requirement for the DUT or corresponding decision circuit 120. The control circuit 32, in this case, must then control the deferred decision's threshold by controlling the pattern generator's DC offset via control signal 37. DC offsets can be injected into either single-ended or differential signals. For example, if a fixed voltage threshold of 0V is used as the threshold for an input signal by the decision circuit in the device under test, then shifting a single-ended data pattern upwards by 1V would mean that the logic decisions would be made on the input signal at a spot minus 1V down on the waveform. A programmable DC-offset circuit 110 is provided for achieving a programmable decision threshold.

The same is true for differential inputs. If a typical differential input is used as a decision circuit where you would get a logic hi if one leg is above the other leg and a logic low if the other leg is above the first leg, then the threshold functioning achieves a logic true if, say, LegA>LegB. If a DC-offset is injected into Leg B, then, to get a logic true out, you would need to have, say, LegA>LegB+Offset. To be symmetrical while achieving the same threshold shift, it may be useful to inject symmetrical DC-offsets to each leg, so you could implement a logic true output when LegA−Offset/2>LegB+Offset/2. In either way, the decision threshold of the receiver's decision circuit 120 is adjusted.

Figure 3:
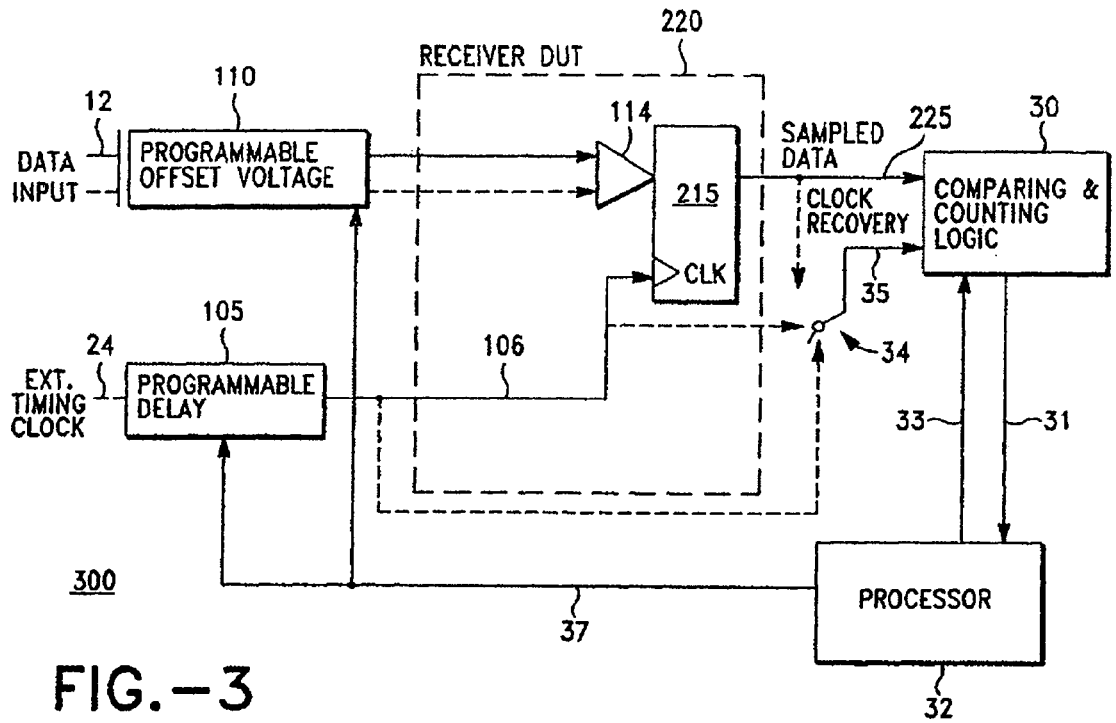
FIG. 3 is a schematic block diagram of a third exemplary embodiment of the present invention including a customized receiver DUT decision circuit with for controlling decision threshold and/or decision timing offset within the bit period for use with this invention.

FIG. 3 is a schematic block diagram of a third embodiment of the present invention, generally indicated by the numeral 300. $_{[IR2]}$As shown, a programmable delay circuit 105 is applied to the external timing signal 24. the delay circuit 105 introduces a programmable amount of delay to the timing signal 24, in response to a timing control signal 37 provided by the control circuit 32; thereby, resulting in a delayed clock signal 106 being applied to the clock (CLK) or trigger input of the sampling component 215 of the decision circuit 220. Supporting external timing reference inputs can replace the need to implement a sample time control and adjustment function inside the decision circuit 220. This is a great convenience to systems that support direct external sample timing control. An example of a device that supports external sample timing control is a d-type flip flop 215 that accepts both the data signal 112 and the sampling clock signal 106. By delaying the sampling clock signal 106, the sampling time of the d-type flip flop 215 is delayed.

In these types of systems, it is equally possible to hold the external timing signal 24 constant (adding no delay) and instead add delay into the data input path using a programmable offset voltage circuit 110. Both are equivalent and achieve a variable sampling time function at the DUT's decision circuit 220. In real world applications, delay in a data path can often cause degradations that can be avoided by inserting delay 105 in the clock path. The control circuit 32 controls the external delay function, whether it is in the clock path 105 or in the data path, to achieve the desired function.

FIG. 3 also illustrates how the external control over programmable delay 105 is combined with the external control of programmable offset voltage 110 to allow deferred decision analysis with no changes to the receiver decision circuit 220. Again, this is only available for those types of devices or systems that support the DC coupling of decision threshold and the external input of the timing reference signal (or clock). For these systems, deferred analysis is available with no added burdens to the receiving circuit.

Figure 4:
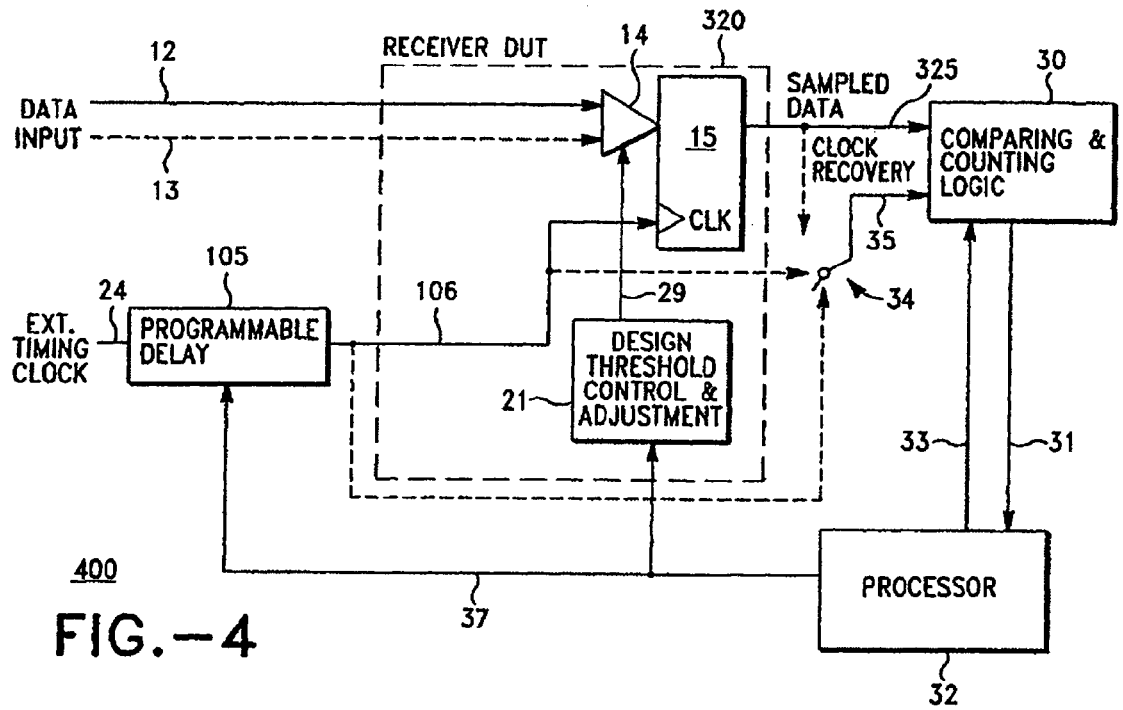
FIG. 4 is a schematic block diagram of a fourth exemplary embodiment of the present invention including a customized receiver DUT decision circuit with enhancements for controlling decision threshold and/or decision timing offset within the bit period for use with this invention.

FIG. 4, is a schematic block diagram of a fourth exemplary embodiment of the present invention, generally indicated by the numeral 400. This fourth embodiment 400, includes an input comparator circuit 14, for example, an operational amplifier or other suitable device providing the sampling input data (e.g. output of the comparator 14) to the sampling component 15. The comparator circuit 14 has a first input coupled to the input signal 12. Alternatively, an optional input signal 13 may be coupled to the second input of the comparator 14; thereby, providing an output signal representing the difference between the input signals 12,13.

The fourth embodiment 400 also illustrates the ability to mix and match the two independent functions of decision threshold 21 and decision timing 105 to support externally setting the decision timing while using internally adjusted decision threshold control. It will be appreciated by those skilled in the art that this embodiment would be applicable only for systems that support an external input for the sample timing signal.

An example of this type of application might be an externally clocked decision circuit 15 (e.g. d-type flip flop) that is AC-coupled for clock and data. The externally applied clock signal 24 can have the variable delay function 105 applied and will achieve a variable sampling time function 106 (even with the AC-coupling). However, an externally applied voltage offset would be stripped by the dc-block used to implement the ac-coupling of the data. Instead, the d-flip flop side of the AC-coupling would need to be augmented with a threshold control function would. The actual control threshold functioning is controlled by the control circuit 32.

FIG. 4 also illustrates another example of the comparison and counting logic 30 employed in accordance with this invention. It is possible to implement lesser analysis functions with lesser complexity to the comparison and counting logic. For example, some analysis functions require knowing counts of one-values and/or zero-values. Other analysis functions require knowing counts of mismatches between the input signal and the expected signal (the expected signal would be known by using a sync-able reference pattern generator in the comparison logic to pre-determine what value is being sought. A sync-able reference pattern is often already included in commercial transceivers as a built-in self-test bit error rate function. This functionality enables the fourth embodiment 400 to do the necessary comparison and counting logic. It will be appreciated that within the scope of this invention, it is contemplated that other methods and devices are also possible. For example, commercial instruments, including bit error rate testers and counters can be used to achieve the desired functionality with the structure and methodology of the invention.

Bit error rate testers provide synchronizable error checking and counting directly. Commercial counters (e.g. event counters) cannot compare logic values nor derive expected values; however, they typically do have count enables, which can be pulsed to create the counts necessary for deferred analysis. Analysis techniques that depend on bit error rate measurements (e.g. synchronizable reference patterns generators) can include mask testing, BER contours, q-factor and jitter measurements.

Figure 5:
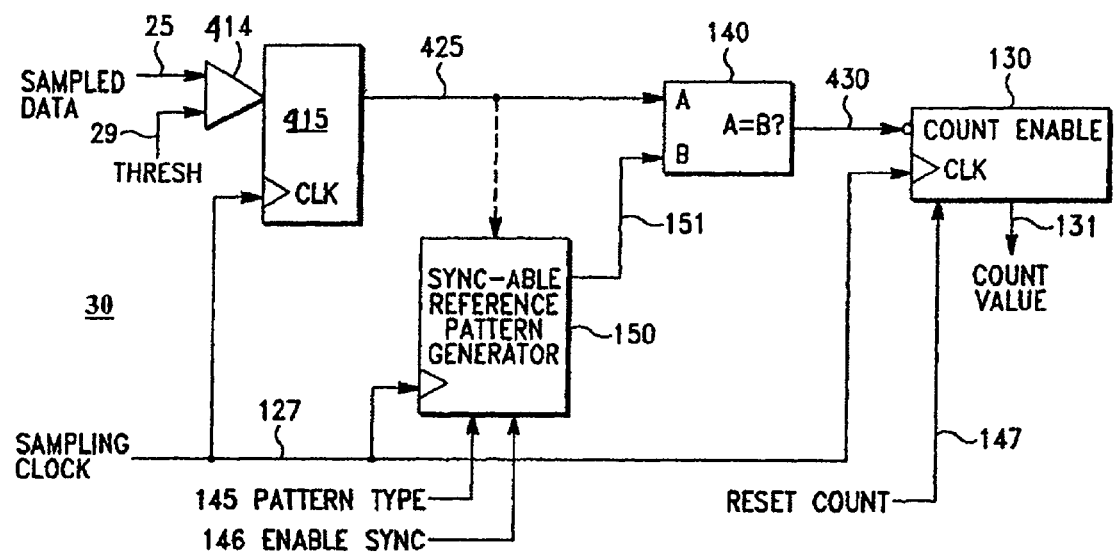
FIG. 5 is a schematic block diagram of an exemplary embodiment of the comparing and counting logic used to collect count information necessary for advanced analysis techniques according to the present invention.

FIG. 5 is a schematic block diagram of the comparison and counting logic 30 implemented in accordance with the present invention. The comparing and counting logic 30 includes a DC coupled flip flop 140, which has two inputs A and B. The first input (A) is coupled to the output 425 of the DUT 425. The second input (B) is coupled to the output 151 of a reference pattern generator circuit 150. A sampling clock signal 127 is provided to the clock (CLK) input of the DUT 415, and the clock input of a sync-able reference pattern generator 150 as well as the clock or trigger input of a counter 130. Sampled data 25 is sent to the DUT and regulated by a threshold value signal 29 determined by the user. The data (output of the comparator 414) is received as a one or zero depending upon the threshold at the first input. The second input receives the sync-able reference pattern 151 from the reference pattern generator circuit 150. The results of the comparison (in this case are the signals on the first and second inputs equal) performed by the flip-flop 140 are sent to the counter 130. The results may be used to generate an eye diagram of the device under test, incorporating the sample results from the one or more modified decision points as such samples are deferred by the memory component 415. Incorporating the deferred sample data is not possible in conventional measurement systems as the sample information from the modified decisions points are typically discarded or otherwise not counted in conventional systems.

Thus an eye diagram is created using the deferred decision methodology in accordance with this invention. In the exemplary embodiment shown in FIG. 5, the DC-coupled flip flop 140, which is internal to the circuit and at a location where it could otherwise not be probed, is imaged. As described with reference to FIG. 4, the method for imaging this application employs the delay controlled externally, namely at the pattern generator circuit 150. The decision threshold 29 is controlled on the flip-flop side of the AC-coupling. As a result of implementing the circuit of the present invention, diagnosis and inspection in circuit areas previously considered impossible to obtain are now possible.

In summary, the present invention discloses a deferred decision circuit and corresponding functionality that enables advanced analysis of the signal quality directly at the receiving decision circuit of a transceiver device under test. By effecting the decision voltage threshold and decision timing within a bit window, advanced waveform analysis can be performed that reflects more accurately the exact nature of the receiving circuit in the transceiver when used to receive digital data in a live applications. Advanced analysis techniques include at least: bit error rate testing, eye diagramming, jitter measurement, Q-factor measurement, eye-diagram mask testing, fast four-corners margin testing, frequency response, step response. Additionally, other analyses that depend upon manipulating the decision point of a digital decision circuit while collecting bit error or probability of occurrence information are achieved. The circuit of the present invention defers the decision from the usual place at the input to the analysis device commonly used for transmitter or channel testing (e.g. an advanced bit error rate tester or oscilloscope) to the decision point of the device under test. Decisions made by the device under test are sent to a counting or other analyzing device (i.e. the advanced bit error rate tester or dedicated hardware inside the device under test added to implement the counting/comparing functions minimally needed to collect data for the advanced analysis techniques). These deferred decisions may be transmitted to subsequent analysis devices allowing all analysis techniques to proceed using the decisions from the device under test.

What is claimed is:

1. A signal analysis circuit, comprising:
   a sampling circuit operative to sample the characteristics of an input signal at various points within an adjustable bit window in response to a sample clock signal;
   a sampling control circuit operative to provide the sample clock signal in response to a sample control signal, the sampling clock signal providing a variable time function wherein input signal characteristics are sampled at several times during the bit window; and
   a control circuit operative to provide the sample control signal in response to the number of times the input signal is within a signal characteristic of interest.

2. The signal analysis circuit of claim 1, further including a decision threshold control circuit operative to provide a programmable threshold control signal operative to adjust the sampling characteristic of interest in response to the sample control signal, the threshold control signal applied independently of the sample clock signal.

3. The signal analysis circuit of claim 1, further including comparison and counting circuitry operative to determine the number of times sampled input signal characteristics is equal to a reference signal pattern.

4. The signal analysis circuit of claim 3, wherein the reference signal pattern is synchronizable to the sampled input signal characteristics.

5. The signal analysis circuit of claim 1, further including a delay circuit operative to insert a programmable amount of delay between the sample clock signal and the sampling circuit.

6. The signal analysis circuit of claim 2, wherein the decision threshold circuit and the sampling control circuit are programmable independently of one another.

7. The signal analysis circuit of claim 1, wherein the sampling circuit is a memory component, and further includes a comparator operative to provide a signal that represents the result of a comparison between the input signal and the threshold control signal.

8. The signal analysis circuit of claim 3, wherein the comparison and counting circuity further includes a reference pattern generator operative to provide a synchronizable reference signal pattern in response to the sample clock signal; a comparator circuit operative to provide a signal in response to a sampled input signal having characteristics equal to the reference signal pattern; and a counting circuit operative to provide a count signal indicating the number of times the sampled input signal and the reference signal are equal.

9. The signal analysis circuit of claim 8, wherein the control circuit generates the sample control signal and the threshold control signal in response to the count signal.

* * * * *